(12) United States Patent
Nakamura

(10) Patent No.: US 6,396,001 B1
(45) Date of Patent: May 28, 2002

(54) PRINTED CIRCUIT BOARD AND METHOD OF MAKING THE SAME

(75) Inventor: Satoshi Nakamura, Kyoto (JP)

(73) Assignee: Rohm Co. Ltd., Kyoto (JP)

( * ) Notice: Subject to any disclaimer, the term of this patent is extended or adjusted under 35 U.S.C. 154(b) by 0 days.

(21) Appl. No.: 09/709,490

(22) Filed: Nov. 13, 2000

(30) Foreign Application Priority Data

Nov. 16, 1999 (JP) .............................. 11-325424

(51) Int. Cl.[7] ................................ H01R 9/09
(52) U.S. Cl. ....................... 174/261; 29/852; 216/18; 216/19; 228/180.21; 361/760
(58) Field of Search ................... 174/261, 260, 174/262; 29/852; 216/18, 19; 228/180.21; 361/760; 427/97; 438/107

(56) References Cited

U.S. PATENT DOCUMENTS 4,047,066 A * 9/1977 Kobayakawa et al. ...... 313/217
5,453,581 A    9/1995 Liebman et al. ............ 174/261
5,892,558 A * 4/1999 Ge et al. ........................ 349/43
6,198,615 B1 * 3/2001 Pelosi et al. ................. 361/119

FOREIGN PATENT DOCUMENTS

DE    2459215   * 12/1974
JP    411121051 *  4/1999

* cited by examiner

Primary Examiner—Albert W. Paladini
(74) Attorney, Agent, or Firm—Michael D. Bednarek; Shaw Pittman LLP

(57) ABSTRACT

A printed circuit board includes a rectangular, insulating substrate and a conductive land formed on the substrate. The land is arranged near a selected one of the longitudinal edges of the substrate. An L-shaped terminal is mounted on the substrate, so that its longer horizontal portion overlaps the land, while its shorter bent portion is engaged with a positioning groove formed in the selected longitudinal edge of the substrate. The land is caused to protrude from the overlapping horizontal portion of the terminal toward the opposite longitudinal edge of the substrate.

8 Claims, 5 Drawing Sheets

PRINTED CIRCUIT BOARD AND METHOD OF MAKING THE SAME

BACKGROUND OF THE INVENTION

1. Field of the Invention

The present invention relates to a printed circuit board and a method of making the same.

2. Description of the Related Art

An example of conventional printed circuit board is shown in FIG. 9 of the accompanying drawings. The illustrated circuit board includes an insulating substrate 200 having a rectangular configuration. Reference sign 200a refers to one of the two longitudinal edges of the substrate 200.

A plurality of conductive lands 210 (four shown in the figure) are formed on the upper surface of the substrate 200 arranged adjacent to the longitudinal edge 200a. The conventional circuit board also includes the same number of connection terminals 100 soldered to a respective one of the lands 210. As seen from FIG. 9, each terminal 100, made of a generally rectangular metal strip, includes a downward bent portion 100a and a horizontal portion 100b which is longer than the bent portion 100a. The terminal 100 is mounted on the substrate 200 with its bent portion 100a held in contact with the longitudinal edge 200a. Though not shown in FIG. 9, a protection circuit is formed on the lower surface of the substrate 200. A plurality of connectors 220 are provided on the lower side of the substrate 200.

To produce a functionally correct printed circuit board, each of the terminals 100 should be positioned accurately to the appropriate land 210. In the conventional device, however, this is rather difficult since the terminal 100 tends to be displaced accidentally when soldered to the land 210.

To address this problem, the terminals 100 may be fixed beforehand in a plastic frame 300, as shown in FIG. 10, with their relative positions properly adjusted. Such a terminal-frame assembly may be manufactured by insert molding. The assembly is then mounted on the substrate 200 so that the respective terminals 100 will be positioned correctly relative to the substrate 200.

With the use of the frame 300, the positioning of the terminals 100 can be performed more easily than when the individual terminals 100 are directly mounted on the substrate 200. Disadvantageously, however, the terminal-frame assembly adds to the thickness and weight of the resulting device. Also, the cost of the insert molding for making the terminal-frame assembly can be rather high.

SUMMARY OF THE INVENTION

The present invention has been proposed under the above circumstances, and therefore it is an object of the present invention to provide a compact, light and inexpensive printed circuit board for which the positioning of terminals is readily performed with high accuracy.

Another object of the present invention is to provide a method of making such an advantageous printed circuit board.

According to a first aspect of the present invention, there is provided a printed circuit board which includes: an insulating substrate provided with an obverse surface, a reverse surface and an edge extending between the obverse and the reverse surfaces; a conductive land formed on the obverse surface; and a terminal including a bent portion and mounted on the substrate to be connected to the land. The above-mentioned edge of the substrate is formed with a groove for receiving the bent portion of the terminal, so that the terminal as a whole will be correctly positioned relative to the substrate.

Preferably, the groove may have a flaring-out cross section. Specifically, the groove may be defined by a bottom surface and two slanted surfaces, wherein the bottom surface has a width substantially equal to the width of the bent portion of the terminal.

According to a preferred embodiment of the present invention, the bent portion received in the groove may extend toward the reverse surface of the substrate, but terminate short of the reverse surface.

According to a second aspect of the present invention, there is provided a printed circuit board which includes: an insulating substrate provided with an obverse surface, reverse surface, a first edge and a second edge opposite to the first edge, the first and the second edges extending between the obverse and the reverse surfaces; a conductive land formed on the obverse surface and arranged adjacent to the first edge; and a terminal mounted on the substrate to overlap the land. The terminal includes a bent portion held in contact with the first edge of the substrate. The land protrudes toward the second edge of the substrate from the terminal.

For the purposes of positioning the terminal more accurately, the first edge of the substrate may be formed with a groove into which the bent portion of the terminal is fitted.

According to a third aspect of the present invention, there is provided a battery pack which includes: a package; a battery held in the package; and a printed circuit board embedded in the package to be electrically connected to the battery. The printed circuit board may includes: an insulating substrate provided with a first edge and an opposite second edge, the first edge being formed with a flaring-out groove; a conductive land formed on the substrate and arranged adjacent to the first edge; and a terminal mounted on the substrate to overlap the land. The terminal includes a bent portion fitted into the flaring-out groove. The package is formed with an opening for exposing the terminal. The land protrudes toward the second edge from the terminal.

According to a fourth aspect of the present invention, there is provided a method of making a printed circuit board. The method includes the steps of: preparing a conductive strip provided with a bent portion; preparing an insulating substrate including an edge at which a groove is formed, a conductive land being arranged on the substrate adjacent to the groove; mounting the strip onto the substrate so that the strip overlaps the land; and soldering the strip to the land with the bent portion held in the groove of the substrate.

According to a fifth aspect of the present invention, there is provided a method of making a printed circuit board. The method includes the steps of: preparing a conductive strip provided with a bent portion; preparing an insulating substrate including a first edge and an opposite second edge, a conductive land being arranged on the substrate adjacent to the first edge; placing the strip on the land with the bent portion held adjacent to the first edge; and soldering the strip to the land with the land protruding toward the second edge of the substrate.

Preferably, the substrate may be formed with a groove arranged adjacent to the land, wherein the the strip is soldered to the land while the bent portion of the strip is fitted in the groove.

Other features and advantages of the present invention will become apparent from the detailed description given below with reference to the accompanying drawings.

DETAILED DESCRIPTION OF THE PREFERRED EMBODIMENTS

The preferred embodiments of the present invention will be described below with reference to the accompanying drawings.

Figure 1:
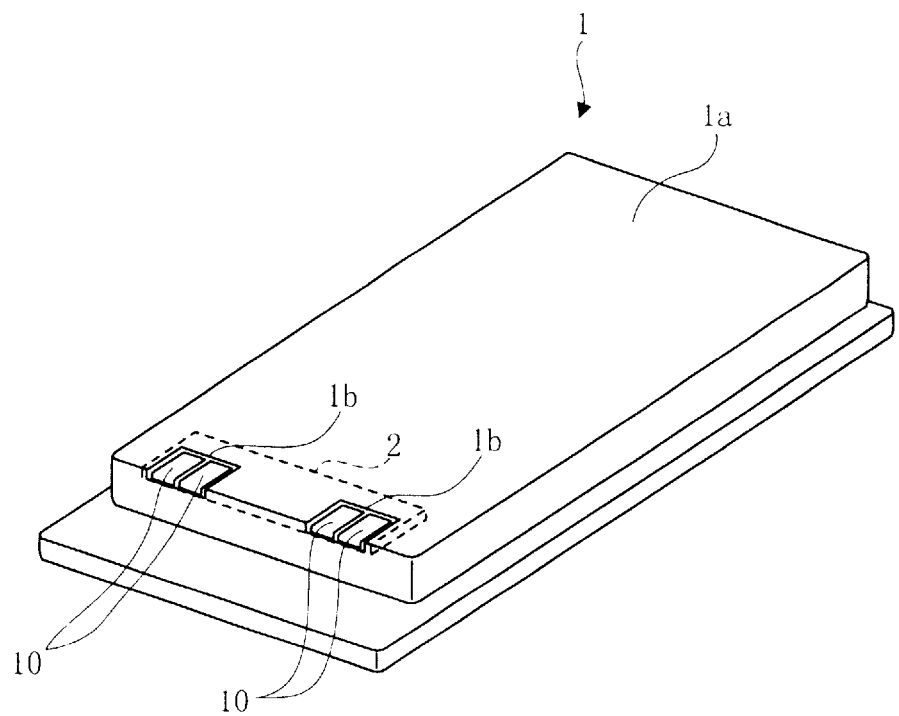
FIG. 1 is a perspective view showing a battery pack incorporating a printed circuit board embodying the present invention.

FIG. 1 shows a battery pack 1 incorporating a printed circuit board (PCB) 2 embodying the present invention. The illustrated battery pack 1, which serves as a power source for a portable phone, includes a flanged package 1a and a battery (not shown) housed in the package 1a. The PCB 2 is entirely embedded in the package 1a except for terminals 10 which are exposed through the windows 1b of the package 1a. When the battery pack 1 is properly set in the main phone unit (not shown), the exposed terminals 10 come into contact with connector pins of the main phone unit, so that required power is supplied to the phone from the battery.

Figure 2:
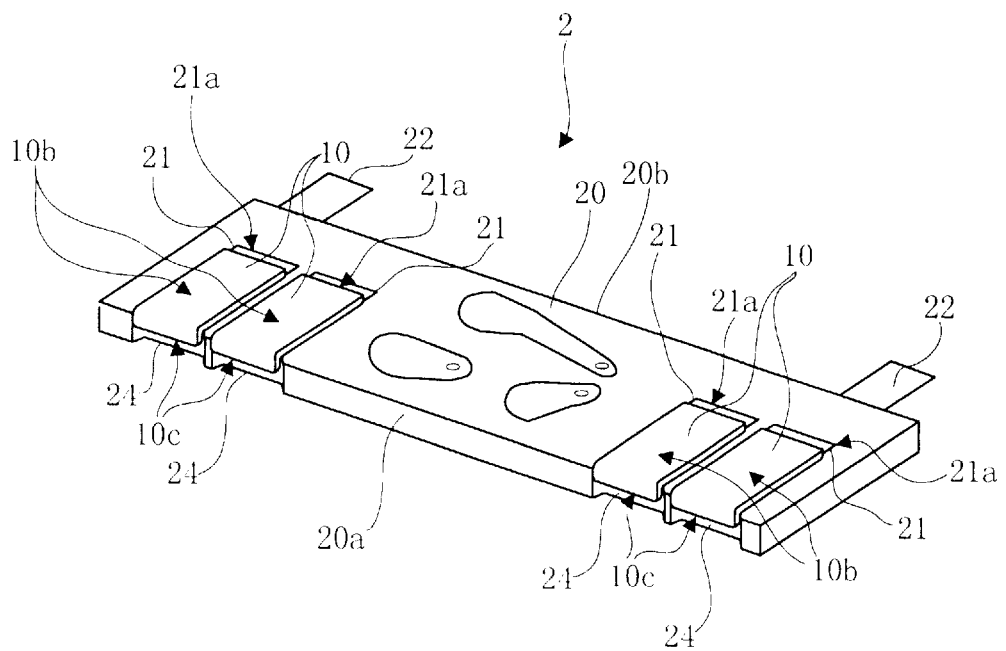
FIG. 2 is a perspective view showing the printed circuit board incorporated in the battery pack of FIG. 1.

Referring to FIG. 2, the PCB 2 includes a rectangular, insulating substrate 20 upon which the terminals 10 are mounted. Each of the terminals 10 overlaps, at one end, a longitudinal edge 20a of the substrate 20, and extends toward, but terminates short of, the other longitudinal edge 20b of the substrate. The lower surface of the substrate 20 is provided with a protection circuit (not shown) which is connected to the terminals 10 via non-illustrated through-holes formed in the substrate 20.

Additional two terminals 22 are provided on the lower side of the substrate 20 to be connected, at one end, to the non-illustrated protection circuit. The terminals 22 are caused, at the other ends, to protrude from the second longitudinal edge 20b of the substrate (see also FIG. 4). When the PCB 2 is embedded in the package la (FIG. 1), the terminals 22 are connected to the non-illustrated battery of the battery pack 1.

Figure 3:
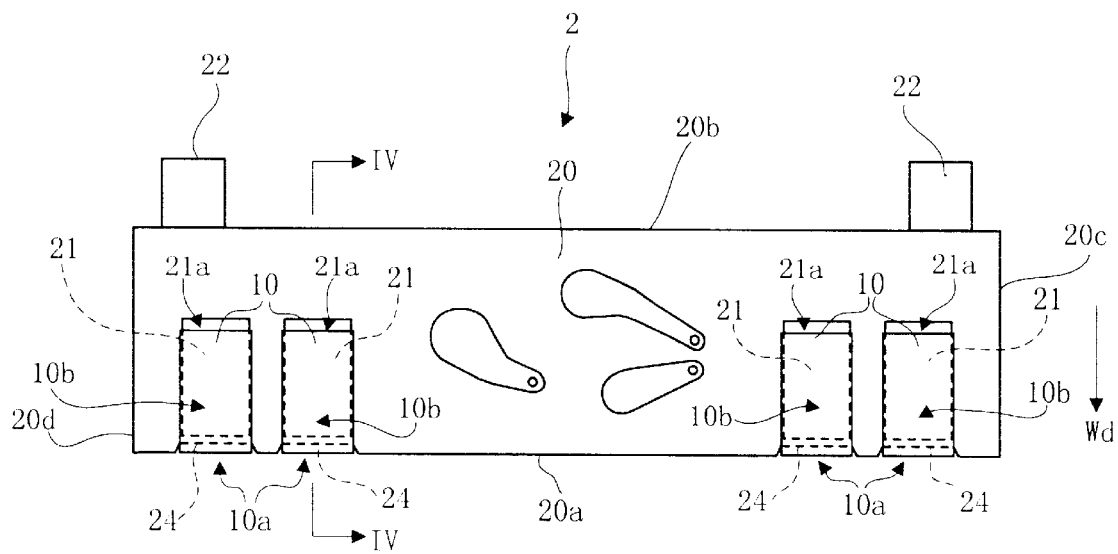
FIG. 3 is a plan view showing the printed circuit board of FIG. 2.
Figure 4:
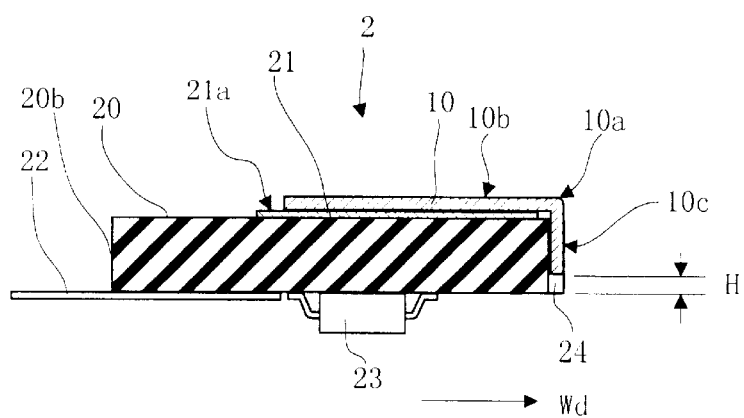
FIG. 4 is a sectional view taken along lines IV—IV in FIG. 3.

Each of the upper-side terminals 10 may be made of a metal strip (such as copper and nickel) plated with gold for example. The thickness of the terminal 10 may be about 0.1–0.2 mm. As best shown in FIG. 4, each terminal 10 is provided with a downward bent portion 10c and a longer horizontal portion 10b extending at the right angle from the upper end 10a of the bent portion 10c. As shown in FIG. 3, the four upper-side terminals 10 are divided into two equal pairs, one of which is arranged closer to a short edge 20c of the substrate 20, while the other pair is arranged closer to the opposite short edge 20d of the substrate. In each pair, the two terminals 10 are spaced slightly from each other for electrical insulation.

As seen from FIGS. 3 and 4, the upper surface of the substrate 20 is formed with four conductive lands 21 each of which corresponds in position to a respective one of the four upper-side terminals 10. The lands 21 and the terminals 10 are soldered to each other, as will be described in detail later. Though not illustrated, each land 21 is connected, via the above-mentioned through-hole, to the lower-side protection circuit. Reference numeral 23 refers to an IC (integrated circuit), which is one of the components constituting the protection circuit. As best shown in FIG. 3, each land 21 is arranged adjacent to the first longitudinal edge 20a of the substrate 20, and has a slightly smaller width than that of the terminal 10. Each land 21 is overlapped by the relevant terminal 10 except for a rectangular end portion 21a which protrudes toward the second longitudinal edge 20b of the substrate 20 from the terminal 10.

As shown in FIGS. 2–4, the substrate 20 is formed, at the first longitudinal edge 20a, with four terminal-receiving grooves 24 extending through the thickness of the substrate 20. These grooves 24 correspond in position to a respective one of the lands 21 (and hence the upper-side terminals 10). Each groove 24 receives the bent portion 10c of the relevant upper-side terminal 10.

Referring to FIG. 4, the bent portion 10c of each terminal 10 is so short that it terminates midway in the groove 24, leaving a clearance H between the lower edge of the bent portion 10c and the bottom surface of the substrate 20. The bent portion 10c can have such a short length since it is provided only for the positioning purposes of the terminal 10 relative to the substrate 20. Thus, the bent portion 10c does not need to be long enough, for example, to reach the lower surface of the substrate 20 to be connected to the protection circuit or any other circuit.

Figure 5:
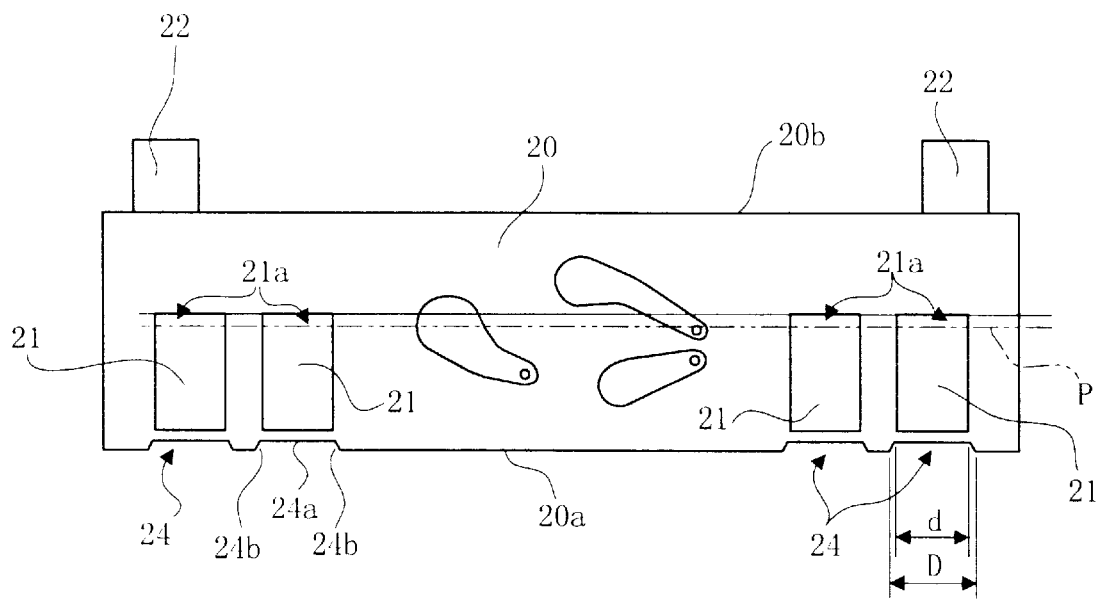
FIGS. 5 and 6 illustrate how the printed circuit board of FIG. 2 is produced.

Referring to FIG. 3, each groove 24 has a trapezoidal cross section, with one side missing (see also FIG. 5). Since the groove 24 flares out, as viewed in a direction Wd, the bent portion 10c will be readily received in the groove 24 when the terminal 10 is mounted on the substrate 20.

Reference is now made to FIGS. 5–8 illustrating a method of making the above-described PCB 2.

First, an insulating substrate 20 as shown in FIG. 5 is prepared. At this stage, the upper-side terminals 10 have not been mounted on the substrate yet, whereas the lower-side terminals 22 are attached to appropriate parts of the lower surface of the substrate 20. The four conductive lands 21, arranged in two equal pairs, are formed on the upper surface of the substrate 20. The lands 21 may be produced by etching a thin conductive layer formed on the substrate 20. In performing this etching, care should be taken so that the rectangular end portion 21a of the resulting lands 21 will be offset toward the second longitudinal edge 20b from the reference line P. Here, the reference line P indicates the farthest point from the first edge 20a that the upper-side terminals 10 (to be mounted later) can reach.

The four grooves 24 are also formed in the substrate 20. Each groove 24 has a flaring-out cross section, as previously stated. More specifically, as shown in the figure, the groove 24 is defined by a bottom surface 24a and two slanted surfaces 24b flanking the bottom surface 24a. The bottom surface 24a has a predetermined width d, which is substantially equal to the width of the terminal 21. The maximum width D of the groove 24 is greater than the width d. Such a groove may be formed by mechanical processing with the use of a cutter for example.

Figure 6:
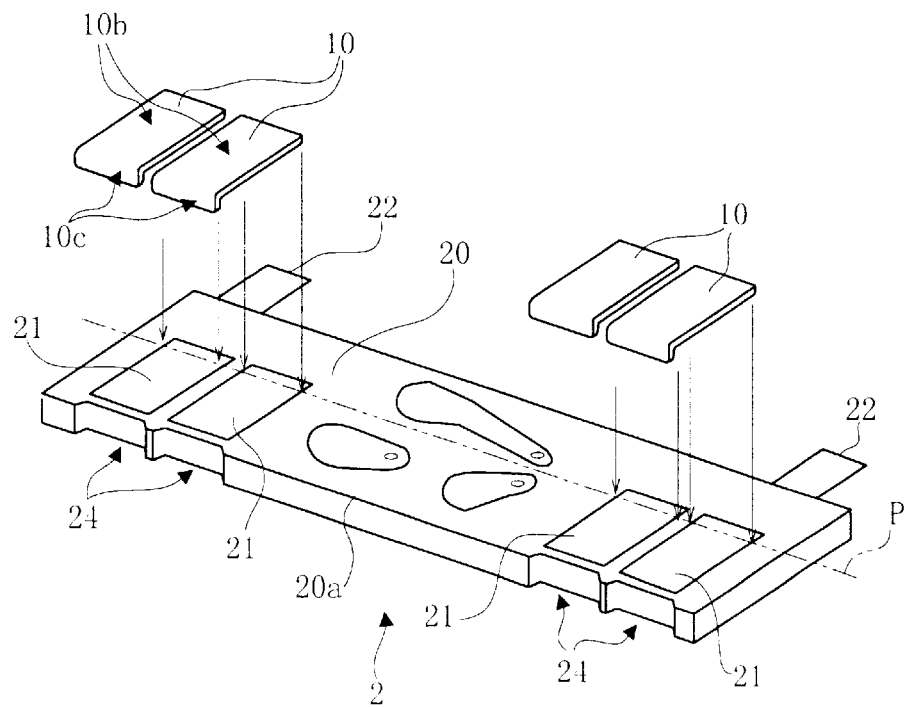

Then, as shown in FIG. 6, the upper-side terminals 10 are connected to a respective one of the lands 21 by reflow soldering. Specifically, first, a solder paste is applied to the entire surface of each land 21. Then, the terminal 10 is mounted on the substrate 20 so that the horizontal longer portion 10b overlaps the land 21 except for the rectangular end portion 21a, while the bent portion 10c is received in the groove 24. It should be noted here that the bent portion 10c can be readily fitted into the groove 24 due to the flaring configuration of the groove.

After the four upper-side terminals 10 are properly put into place on the substrate 20, the substrate 20 together with the terminals 10 is heated up to melt the solder paste applied between the respective terminals 10 and the lands 21.

Figure 7:
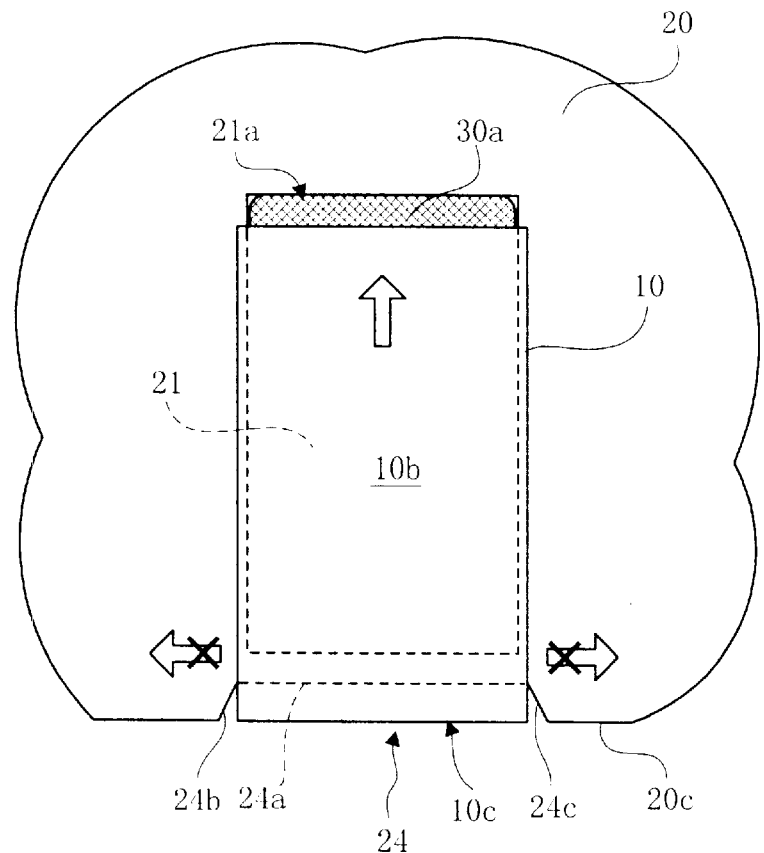
FIGS. 7 and 8 illustrate how the automatic positional adjustment of a terminal is performed in reflow soldering.
Figure 8:
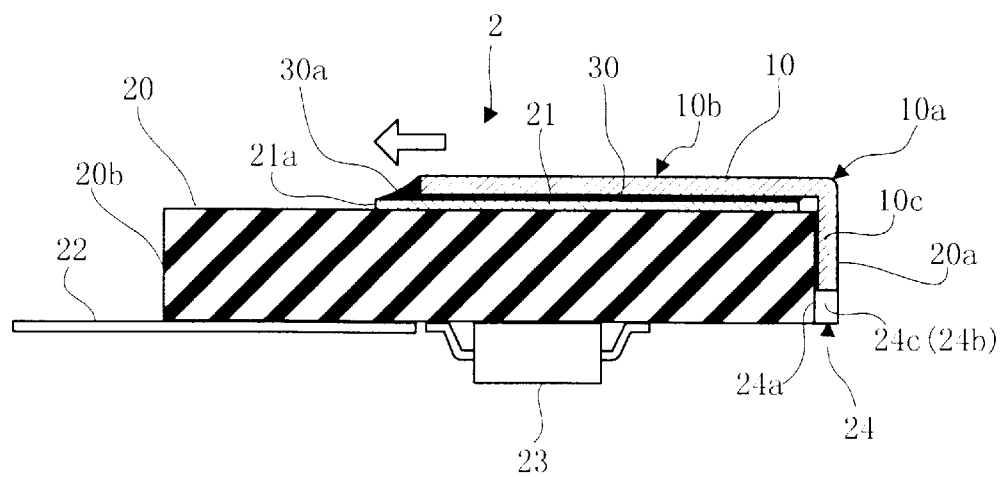
Figure 9:
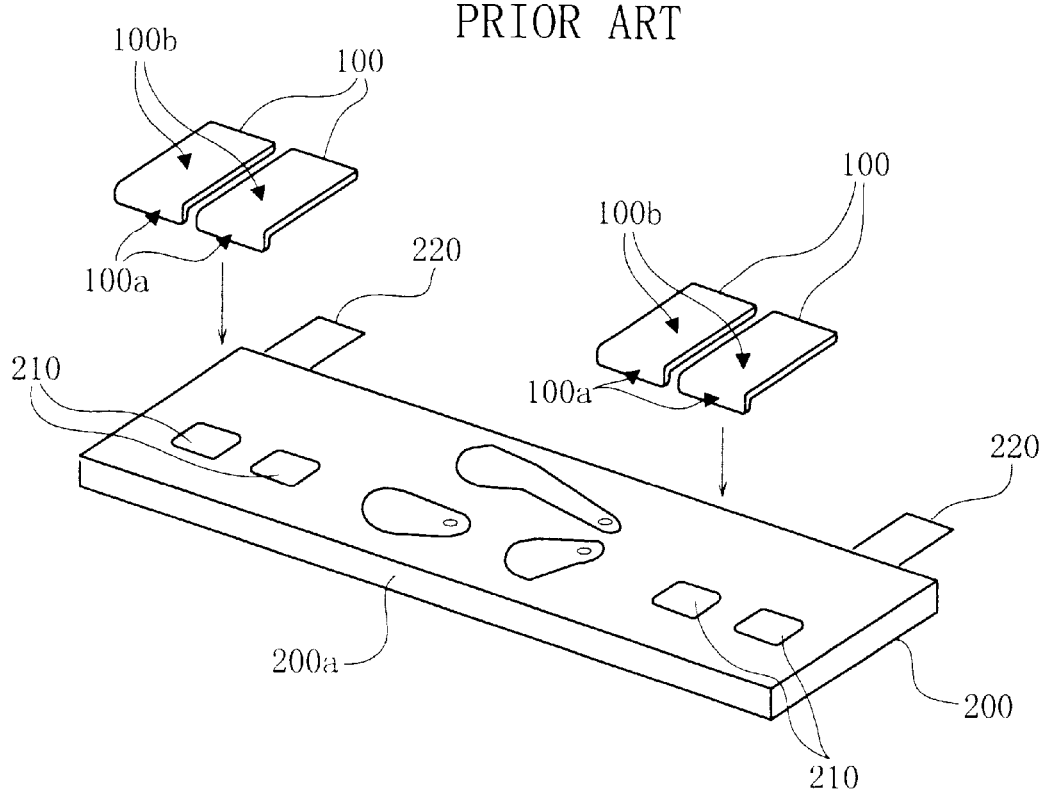
FIG. 9 shows a conventional printed circuit board.

Referring to FIGS. 7 and 8, while the solder paste 30 is in the molten state, the upper-side terminal 10 is urged toward the second longitudinal edge 20b due to the surface tension of the fillet portion 30a (see the cross-hatching in FIG. 7) of the melted solder paste 30. Thus, the bent portion 10c of the terminal 10 will be brought into contact with the substrate 20, whereby the terminal 10 as a whole is put into proper position relative to the substrate 20. It should be noted here that the width of the land 21 is slightly smaller than that of the overlapping terminal 10. Thus, the surface tension of the molten solder paste 30 applied over the land 21 will hardly work for pulling the terminal 10 in the lateral directions (i.e., to the right or left in FIG. 7).

Even if the molten solder paste 30 may exert a lateral pulling force on the terminal 10, the deviation of the terminal 10 can be reliably prevented by the flaring-out groove 24, which is designed to snugly hold the bent portion 10c of the terminal 10.

When the molten solder solidifies as it cools, the fillet portion 30a will contract to certain extent, thereby additionally pulling the upper-side terminal 10 toward the second longitudinal edge 20b. As a result, the bent portion 10c of the terminal 10 will be brought into more intimate contact with the substrate 20, so that more accurate positioning of the terminal 10 can be achieved. Obviously, such automatic positioning of the terminals 10 is advantageous to improving the production efficiency of printed circuit boards.

Figure 10:
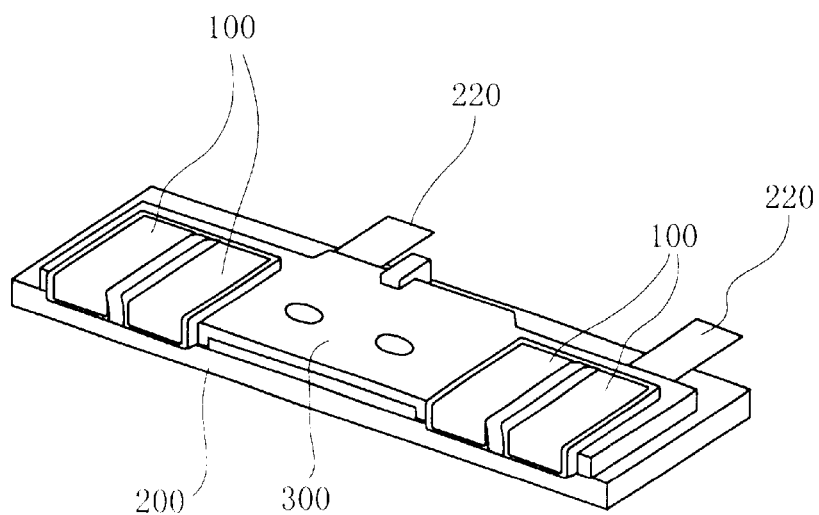
FIG. 10 shows another conventional printed circuit board.

According to the present invention, the PCB 2 is rendered compact and light since the terminals 10 are directly mounted on the substrate 20. Accordingly, a compact and light battery pack can be produced with the use of the PCB 2. Another advantage is that the production cost of the PCB 2 will be rendered relatively low since no additional terminal-holding frame (see FIG. 10) is needed.

In the above-described embodiment, the PCB 2 is depicted as a component used for making a battery pack of a portable telephone, though the present invention is not limited to this. Clearly, the present invention is also applicable to making other types of printed circuit boards.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A printed circuit board comprising:
   an insulating substrate provided with an obverse surface, a reverse surface and an edge extending between the obverse and the reverse surfaces;
   a conductive land formed on the obverse surface; and
   a terminal mounted on the substrate to be connected to the land, the terminal including a bent portion;
   wherein the edge of the substrate is formed with a groove for receiving the bent portion of the terminal; and
   wherein the groove has a flaring-out cross section and is defined by a bottom surface and two slanted surfaces, the bottom surface having a width substantially equal to a width of the bent portion of the terminal, the groove having a maximum width which is larger than the width of the bent portion of the terminal.

2. The printed circuit board according to claim 1, wherein the bent portion received in the groove extends toward the reverse surface of the substrate to terminate short of the reverse surface.

3. A printed circuit board comprising:
   an insulating substrate provided with an obverse surface, reverse surface, a first edge and a second edge opposite to the first edge, the first and the second edges extending between the obverse and the reverse surfaces;
   a conductive land formed on the obverse surface and arranged adjacent to the first edge; and
   a terminal mounted on the substrate to overlap the land, the terminal including a bent portion held in contact with the first edge of the substrate;
   wherein the land has an end portion which protrudes toward the second edge of the substrate beyond the terminal, the end portion of the land being provided with a solder fillet held in contact with the terminal.

4. The printed circuit board according to claim 3, wherein the first edge of the substrate is formed with a groove into which the bent portion of the terminal is fitted.

5. A battery pack comprising:
   a package;
   a battery held in the package; and
   a printed circuit board embedded in the package to be electrically connected to the battery:
   wherein the printed circuit board comprises: an insulating substrate provided with a first edge and an opposite second edge, the first edge being formed with a flaring-out groove; a conductive land formed on the substrate and arranged adjacent to the first edge; and a terminal mounted on the substrate to overlap the land, the terminal including a bent portion fitted into the flaring-out groove, the package being formed with an opening for exposing the terminal, the land protruding toward the second edge from the terminal.

6. A method of making a printed circuit board comprising the steps of:
   preparing a conductive strip provided with a bent portion;
   preparing an insulating substrate including an edge at which a groove is formed, a conductive land being arranged on the substrate adjacent to the groove;
   mounting the strip onto the substrate so that the strip overlaps the land; and
   soldering the strip to the land with the bent portion held in the groove of the substrate;
   wherein the groove has a flaring-out cross section and is defined by a bottom surface and two slanted surfaces, the bottom surface having a width substantially equal to a width of the bent portion of the strip, the groove having a maximum width which is larger than the width of the bent portion of the terminal.

7. A method of making a printed circuit board comprising the steps of:
   preparing a conductive strip provided with a bent portion;
   preparing an insulating substrate including a first edge and an opposite second edge, a conductive land being arranged on the substrate adjacent to the first edge;
   placing the strip on the land with the bent portion held adjacent to the first edge; and soldering the strip to the land;

wherein the land has an end portion which protrudes toward the second edge of the substrate beyond the terminal, the soldering step being performed to form a solder fillet on the end portion of the land in contact with the terminal.

8. The method according to claim 7, wherein the substrate is formed with a groove arranged adjacent to the land, the strip being soldered to the land while the bent portion of the strip is fitted in the groove.

* * * * *